United States Patent
Sievilä et al.

(10) Patent No.: US 12,176,202 B2
(45) Date of Patent: Dec. 24, 2024

(54) MANUFACTURE METHOD OF A HIGH-RESISTIVITY SILICON HANDLE WAFER FOR A HYBRID SUBSTRATE STRUCTURE

(71) Applicant: OKMETIC OY, Vantaa (FI)

(72) Inventors: Päivi Sievilä, Espoo (FI); Samuli Sievänen, Helsinki (FI); Jukka-Pekka Lähteenmäki, Vantaa (FI); Karri Mannermaa, Vantaa (FI); Joel Salmi, Helsinki (FI); Atte Haapalinna, Espoo (FI)

(73) Assignee: OKMETIC OY, Vantaa (FI)

( * ) Notice: Subject to any disclaimer, the term of this patent is extended or adjusted under 35 U.S.C. 154(b) by 532 days.

(21) Appl. No.: 17/065,719

(22) Filed: Oct. 8, 2020

(65) Prior Publication Data

US 2022/0115226 A1    Apr. 14, 2022

(51) Int. Cl.
| | | |
|---|---|---|
| H01L 21/02 | (2006.01) | |
| B24B 49/12 | (2006.01) | |
| B24B 51/00 | (2006.01) | |
| H01L 21/304 | (2006.01) | |

(52) U.S. Cl.
CPC ........ H01L 21/02013 (2013.01); B24B 49/12 (2013.01); B24B 51/00 (2013.01); H01L 21/02024 (2013.01); H01L 21/304 (2013.01)

(58) Field of Classification Search
CPC ..................................... H01L 21/02002–02035
See application file for complete search history.

(56) References Cited

U.S. PATENT DOCUMENTS

| | | | | |
|---|---|---|---|---|
| 3,648,340 | A * | 3/1972 | MacIver ................. | H01L 29/93 257/595 |
| 5,429,711 | A * | 7/1995 | Watanabe ............... | C30B 33/00 438/692 |
| 5,789,308 | A * | 8/1998 | DeBusk .................. | C30B 29/06 438/763 |
| 6,461,222 | B1 * | 10/2002 | Sato ........................ | B24B 49/12 451/6 |
| 6,482,749 | B1 * | 11/2002 | Billington ................ | C11D 7/06 257/E21.309 |

(Continued)

FOREIGN PATENT DOCUMENTS

WO    WO-2016069014 A1 *  5/2016  ............... H01Q 9/28

*Primary Examiner* — Kevin Parendo
(74) *Attorney, Agent, or Firm* — Thomas | Horstemeyer, LLP

(57) ABSTRACT

The application relates to a manufacture method of a high-resistivity silicon handle wafer for a hybrid substrate structure. The method comprises a step of producing the wafer having a crystal orientation identifier and a certain thickness. The method further comprises a step of thinning the produced wafer from the certain thickness to a desired thickness of the wafer in order to obtain the thinned wafer. The method further comprises a step of providing a surface passivation layer having a certain layer thickness on a front surface of the thinned wafer. The method further comprises a step of polishing the passivation layer from the certain layer thickness to a desired final layer thickness of the passivation layer so that the polished front surface of the wafer enables active layer bonding in order to form the hybrid substrate structure.

13 Claims, 2 Drawing Sheets

(56) References Cited

U.S. PATENT DOCUMENTS

| | | | |
|---|---|---|---|
| 6,545,764 B1* | 4/2003 | Laczik | G01N 21/9501 356/601 |
| 6,576,501 B1* | 6/2003 | Beauchaine | H01L 21/3221 257/E21.318 |
| 2002/0004359 A1* | 1/2002 | Arai | B24B 41/068 451/41 |
| 2007/0235133 A1* | 10/2007 | Benassi | B24B 37/013 438/692 |
| 2009/0124060 A1* | 5/2009 | Nagaya | H01L 21/8213 438/692 |
| 2010/0021688 A1* | 1/2010 | Katoh | H01L 21/3221 438/692 |
| 2015/0145105 A1* | 5/2015 | Haapalinna | H01L 29/04 257/617 |
| 2017/0040210 A1* | 2/2017 | Wakabayashi | H01L 21/76254 |
| 2017/0084478 A1* | 3/2017 | Nguyen | H01L 21/76254 |
| 2018/0036864 A1* | 2/2018 | Kawasaki | H01L 21/02013 |
| 2018/0079052 A1* | 3/2018 | Xu | B24B 37/013 |
| 2018/0158721 A1* | 6/2018 | Libbert | H01L 21/0262 |
| 2018/0233400 A1* | 8/2018 | Wang | H01L 21/0245 |
| 2019/0039187 A1* | 2/2019 | Sekiya | B23K 26/53 |
| 2019/0181059 A1* | 6/2019 | Sato | H01L 22/12 |
| 2019/0304769 A1* | 10/2019 | Hirata | B23K 26/0853 |
| 2019/0348270 A1* | 11/2019 | Morita | B24B 9/065 |
| 2020/0216975 A1* | 7/2020 | Basak | H01L 21/02123 |

\* cited by examiner

MANUFACTURE METHOD OF A HIGH-RESISTIVITY SILICON HANDLE WAFER FOR A HYBRID SUBSTRATE STRUCTURE

TECHNICAL FIELD

The application relates generally to a manufacture method of a high-resistivity silicon handle wafer for a hybrid substrate structure, a high-resistivity silicon handle wafer, and a hybrid substrate structure.

BACKGROUND

Devices, which are manufactured on hybrid wafers, utilize an active layer that is bonded to a single crystal silicon handle wafer and thinned against it. The handle wafer enables to a reliable handling of hybrid material with advanced tools, which are designed for standard silicon wafer processing, and it provides mechanical stability and compatibly with cleanliness and chemicals, which are used in semiconductor manufacturing. One example of such devices is piezoacoustic thin film surface acoustic wave (TF-SAW) filters, which are designed to utilize a thin active layer made of e.g. piezomaterial.

Hybrid wafer structures, which are used for devices operating at radio frequencies (RF) of several hundreds of MHz to several tens of GHz, require the use of very high resistivity (over 5000 Ω-cm) silicon substrates, featured with an additional parasitic current suppression surface passivation layer, in order to minimize an interaction of the RF signal with the handle wafer.

The performance of these devices, which are on the thinned-down active layer, is to a large extend limited by their geometric accuracy. The final device geometry is defined both by the manufacture process of the device and the thickness control of the active layer in a substrate process. As the accuracy of the device manufacture process is defined using lithography, the precision achievable with modern processes is very high. This increases the relative importance of active layer thickness variation, as this dimension cannot be controlled in the same manner.

The geometry of the handle wafer strongly influences the geometry of the thinned-down active layer, typically resulting a thickness variation roughly the same in absolute terms (µm). As the active layer is very thin in comparison to the handle wafer thickness, the proportional geometry variation becomes significantly higher. Thus, the flatness requirement for the handle wafer is far beyond to that of standard silicon substrates. In accordance with SEMI M1, a total thickness variation (TTV) is defined as 10 µm for 625 µm-thick polished wafers with a 150 mm diameter.

The TTV is especially critical when it appears non-circular symmetrically over a wafer surface, as a further rotational active layer thinning process can be relatively easily adjusted in radial direction, but correcting other shapes is much more complicated.

The preceding drawbacks have limited significantly the performance of existing devices having the thinned-down active layer.

SUMMARY

One object of the invention is to withdraw drawbacks of known solutions and to provide a manufacture method for a high-resistive, surface-passivated silicon handle wafer, which compensates a geometric influence of a produced crystal orientation identifier and enables higher flatness of a 150-200 mm-diameter silicon handle wafer used in a hybrid substrate structure.

One object of the invention is fulfilled by providing a manufacture method, a high-resistivity silicon handle wafer, and a hybrid substrate structure according to the independent claims.

Embodiments of the invention are defined in the independent claims.

One embodiment of the invention is a manufacture method of a high-resistivity silicon handle wafer for a hybrid substrate structure. The method comprises a step of producing the wafer having a crystal orientation identifier and a certain thickness. The method further comprises a step of thinning the produced wafer from the certain thickness to a desired thickness of the wafer in order to obtain the thinned wafer. The method further comprises a step of providing a surface passivation layer having a certain layer thickness on a front surface of the thinned wafer. The method further comprises a step of polishing the passivation layer from the certain layer thickness to a desired final layer thickness of the passivation layer so that the polished front surface of the wafer enables active layer bonding (bonding of an active layer) in order to form the hybrid substrate structure. The step of thinning comprises a controlled single-side, fixed abrasive grinding of the produced, crystal orientation identifier-comprised wafer with a chuck arrangement, which eliminates at least partly an effect of non-circular asymmetry caused by the identifier, in order to manufacture the wafer with a desired submicron total thickness variation.

One embodiment of the invention is a high-resistivity silicon handle wafer for a hybrid substrate structure, which is manufactured in accordance with the steps of previous method embodiment.

One embodiment is a hybrid substrate structure, which comprises the high-resistivity silicon in accordance with the previous handle wafer embodiment.

Further embodiments of the invention are defined in the dependent claims.

BRIEF DESCRIPTION OF THE FIGURES

The exemplary embodiments of the invention are explained with reference to the accompanying figures.

DETAILED DESCRIPTION OF THE FIGURES

Figure 1A:
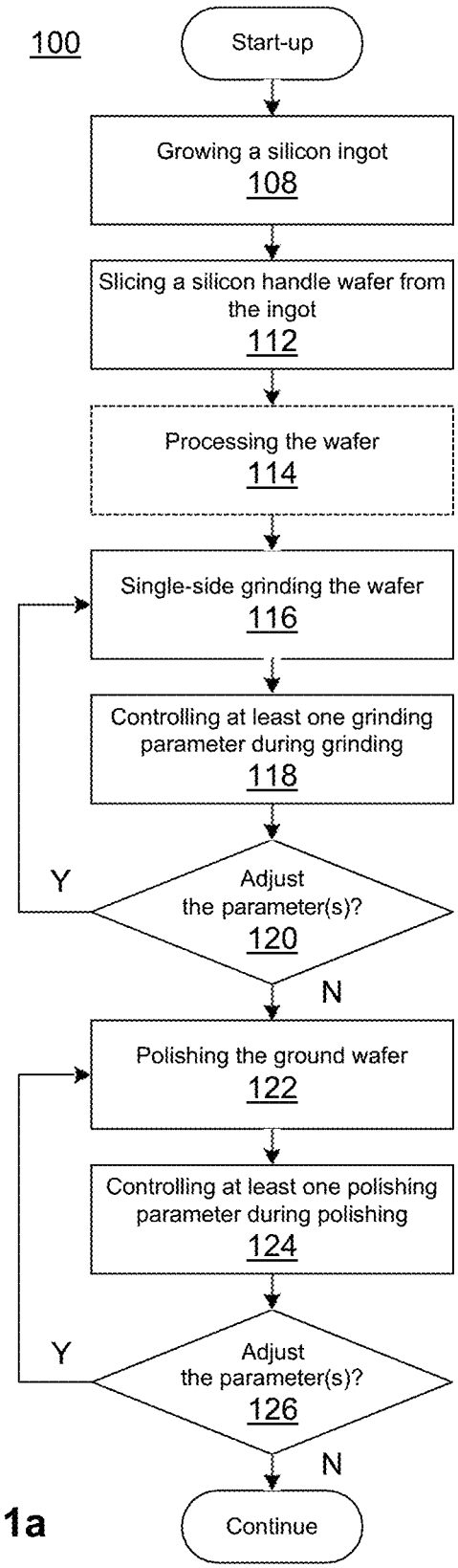
FIG. 1a-1b present a flowchart of manufacture method of a handle wafer
Figure 2A:
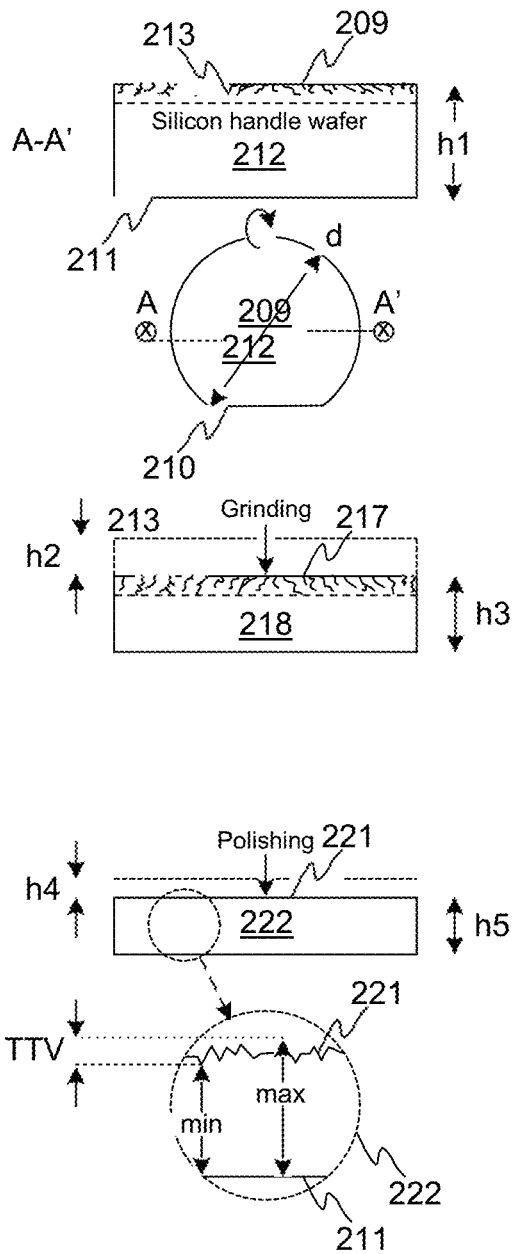
FIG. 2a-2b present how the handle wafer is processed during the manufacture method
Figure 1B:
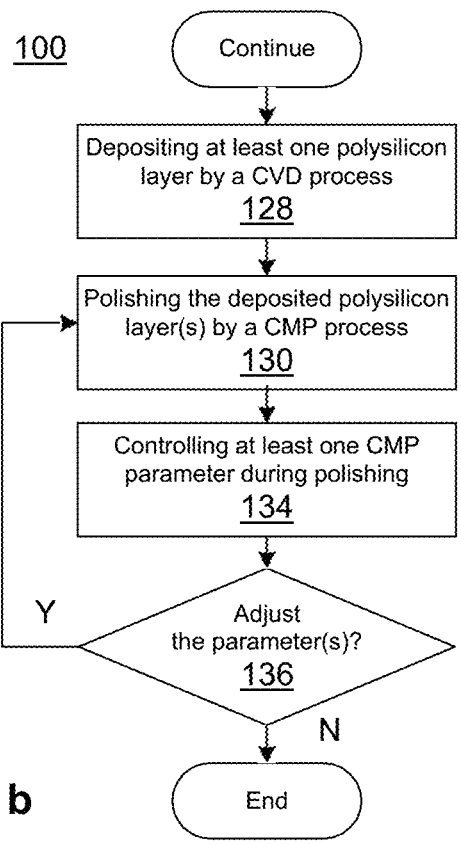
Figure 2B:
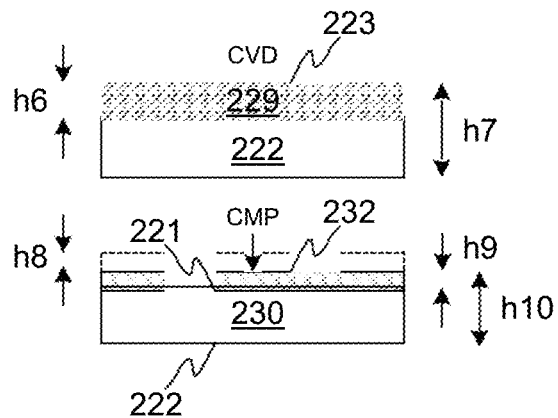

FIGS. 1a and 1b present how steps of manufacture method 100 of a high-resistivity silicon (HRS) handle wafer 230 for a hybrid substrate structure 336 proceed and, beside the method steps, FIGS. 2a and 2b how each method step effects to the wafer 230.

Figure 3A:
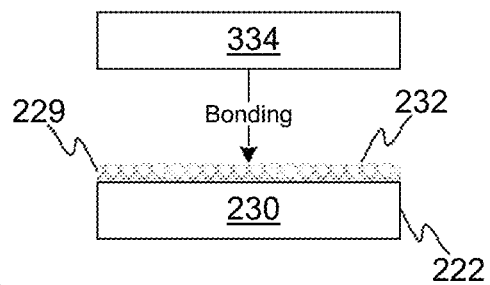
FIG. 3a-3b present how an active layer is bonded to the manufactured handle wafer and thinned to form a hybrid substrate structure
Figure 3B:
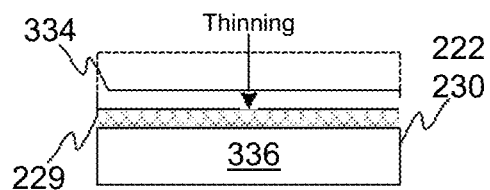

FIGS. 3a and 3b present the hybrid substrate structure 336, which may be used in manufacturing a piezoacoustic thin film surface acoustic wave (TF-SAW) filter or other, e.g. sapphire-on-silicon, III-IV hybrid substrate structure, or II-VI hybrid substrate structure, which is based on thinned down material layers. The hybrid substrate structure 336 utilizes a thin active layer 334, which is made of sapphire or compound semiconductor material, and which is fusion bonded in accordance with FIG. 3a and thinned against the wafer 230 in accordance with FIG. 3b.

At step 108, a crystal puller, which is suitable either for a float zone (FZ) or Magnetic Czochralski (MCz) silicon crystal growth, is used in crystal growing. Special preparations, which are necessary for extremely low impurity crystal growth are carried out, e.g. the verification of very high cleanliness status of crystal growth chamber, the availability of very high purity inert gas, and the extremely tight control of impurities added to a polysilicon charge to be used.

Then, at step 108, a HRS ingot, which has a target diameter (d) of 150-210 mm, e.g. 150, 160, 170, 180, 190, or 200 mm, is pulled in the growing chamber as the first stage of production of the wafer 230. The grown HRS ingot is cut and ground for producing a crystal orientation identifier 210, which is e.g. a primary flat when the diameter d of HRS ingot is 150 mm or a notch when the diameter d is 200 mm, along a side of the HRS ingot.

The primary flat 210, which is used as an example of an identifier 210 in these figures, is used as a standard identifier in order to identify the surface orientation for a 150 mm silicon wafer 230. The surface orientation of a silicon wafer 230 is required to be exactly {111} or very close to it, or exactly {100} or very close to it, typically at most with 0.5 degree tolerance. The primary flat 210 is an irregularity in the round shape of a silicon wafer 230 that invariably causes flatness degradation in mechanical thinning steps typically used in wafer manufacturing, e.g. grinding and polishing steps 116, 122.

The method 100 compensates the influence of the identifier 210 and enables higher flatness for the silicon wafer 230, e.g. for the 150 mm-diameter silicon wafer 230, specification of which typically requires the primary flat 210 because of processing tool requirements for this wafer size, and for a 200 mm-diameter silicon wafer 230.

At step 112, HRS wafers 212 are sliced from the produced HRS ingot, e.g. by multi-wire slicing in accordance with the current industry standard. The slicing process applies mechanical force to remove material and creates sub-surface crystal lattice damage into and under the front (top) surface 209 of sliced wafers 212. Naturally, similar crystal lattice damage is also incorporated into and under the back surface 211 of sliced wafers 212. The incorporated crystal lattice damage creates a disordered lattice damage zone 213 into the front (top) side of sliced wafers 212 and another disordered lattice damage zone (not presented in the figures) into the back side of sliced wafers 212.

Each sliced wafer 212 comprises single crystal silicon, the identifier 210 and the first thickness h1, which is a distance between the front and back surfaces 209, 211.

At step 114, the sliced wafer 212 may be thinned at least from its front side by lapping in order to remove at least partly the slicing-based crystal damage, i.e. the disordered zone 213, and the lapped wafer 212 may be cleaned.

Since the lapping process also incorporates mechanically some sub-surface crystal lattice damage into the sliced wafer 212, the lapped wafer 212 comprises the disordered zone 213. Alternatively, if the slicing-based crystal damage is meant to retain at least partly in the lapped wafer 212, it is possible to modify the lapping process so that at least a part of the slicing-based disordered zone 213 remains, whereupon the lapped wafer 212 comprises the slicing and lapping-based crystal damages.

Then, at step 114, the lapped wafer 212 may be acid etched in order to remove at least partly the produced crystal damage(s) and, then, the etched wafer 212 is inspected visually, cleaned, and processed by thermal donor anneal.

At step 116, the processed, identifier 210-comprised wafer 212 is attached to a chuck arrangement of a grinding machine and only its front surface 209 on the front side of the wafer 212 is exposed to a controlled single-side, fixed abrasive grinding, which is carried out by a rotating grinding wheel of the grinding machine.

As a result of the fixed abrasive grinding process, the thickness of the wafer 218 decreases about a distance h2 from the first thickness h1 to a third thickness h3 so that its front surface 217 approaches the back surface of wafer 218 said distance h2. Additionally, the fixed abrasive grinding process incorporates mechanically again some sub-surface crystal lattice damage into and under the front surface 217 of the ground wafer 218, and creates the disordered zone 213 into the front side of the ground wafer 218, if such does not already exist.

The effective, short control loop controlled, fixed abrasive grinding process eliminates at least partly, in fact significantly, the effect of asymmetric variation (non-circular asymmetry), which is caused at least partly by the identifier 210 from the front surface 217 of the ground wafer 218 so that it is possible to obtain a desired total thickness variation (TTV) on the wafer 218. The TTV defines the difference between the minimum (min, lowest) thickness and the maximum (max, highest) thickness of the wafer 218, 222, 230 in accordance with FIG. 2a.

At step 118, during the fixed abrasive grinding process, it is monitored continuously by at least one of an optical measurement (equipment, system) and a charge carrier-adjusted capacitive measurement (equipment, system), and at least one grinding parameter is controlled continuously.

For HRS wafers 212, 218 the standard capacitive measurement cannot be reliably applied due to the lack of conductivity in the material to be measured. Additionally, the control of achievable accuracy in thickness is not sufficient. Thus, the use of optical or charge carrier-adjusted capacitive measurement, which enables higher accuracy, is needed to meet the thickness variation requirements for wafers 230, which are used in the hybrid substrate structure 336.

When using capacitive measurements, effective electrostatic discharging (ESD) is incorporated in the measurement equipment. Cross correlation of optical and suitably modified capacitive geometry measurement enhances the measurement system as a whole as these technologies complement each other. A measurement system, that reliably gives accurate, high-resolution data of the whole wafer geometry even for ultra high resistivity silicon, enables effective, short feedback loop needed to obtain the required precise geometry control. With method 100, it is possible to achieve clearly superior flatness capability compared to an integrated and automated flatness control feature that can be found in typical commercially available tools for single-side grinding of silicon wafers 212, which typically claim capabilities between 1 and 2 μm in the TTV.

The grinding parameter(s) comprises at least one of the cooling water temperature of the chuck arrangement, the grinding chuck inclination of the chuck arrangement, and the grinding feed rate of the grinding wheel.

At step 120, if it is necessary to adjust the grinding parameter(s) because of a predetermined grinding plan or an emerged need as a result of monitoring, said grinding parameter(s) is adjusted during the fixed abrasive grinding process in order to achieve the desired TTV.

For example, the tolerance of cooling water temperature is in a range of ±1° C. or better. The inclinations of grinding chuck between the wafer 212 and the grinding wheel are constantly monitored, e.g. 0.5 to 2 per hour in a constant operation and adjusted with short feedback loop. The incoming TTV is in a range of 1 to 5 μm. In order to obtain high surface quality and to enable stable cutting efficiency for the grinding wheel, the grinding feed rate is in a range of 0.15 to 1 μm per second. Additionally, a diamond size and type of grinding wheel is selected for the best combination of throughput, robustness, and surface quality. The particle cleanliness of the incoming wafer 218 must be sufficient to prevent generation of local excess material removal.

At step 122, the single-side ground wafer 218 is attached to a wafer carrier of a polishing machine and only its ground front surface 217 on the front side of the wafer 218 is exposed to a controlled polishing, which is carried out by a rotating polishing pad of the polishing machine.

As a result of the polishing process, the thickness of the wafer 222, as well as its lattice damage zone 213, decreases about a fourth distance $h4$ from the third thickness $h3$ to a fifth thickness $h5$ so that its polished front surface 222 approaches the back surface of wafer 222 said fourth distance $h4$. Additionally, the polishing process removes the sub-surface crystal lattice damage under the front surface 221 of the polished wafer 218.

The polishing process finishes the elimination of the thickness variation from the polished wafer 222 so that the polished wafer 222 meets the desired TTV level.

The desired TTV of the wafer 222, 230 is less than 600 nm, e.g. 200, 300, 400, or 500 nm.

At step 124, during the polishing process, it is monitored continuously by a Makyoh mirror, an optical measurement (equipment) or a geometry-monitoring suitable carried-adjusted capacitive measurement (equipment, system), and a surface scanning equipment (system) and at least one polishing parameter is controlled continuously.

The polishing parameter(s) comprises at least one of the polishing pressure of the wafer 222 and the polishing pad, the rotation speed of the wafer 222 and the polishing pad, and the location of the wafer 222 relative to the polishing pad.

At step 126, if it is necessary to adjust the polishing parameter(s) because of a predetermined polishing plan or an emerged need as a result of monitoring, said at least one polishing parameter is adjusted during the polishing process in order to achieve the desired TTV, to complete the thinning steps 116, 122 so that the thinned wafer 222 is ready for a treatment, which produces parasitic current suppression in radio frequencies (RF).

At step 128, the thinned wafer 222 is set into a deposition chamber of a deposition machine and at least one polysilicon layer 229 is deposited on its front surface 221 by a chemical vapour deposition (CVD) process. The deposited polysilicon layer(s) 229 comprises a highly uniform polysilicon film, which has a total layer thickness $h6$.

As a result of the deposition process, the thickness of the wafer 222 increases about a sixth distance, which is equal with the total layer thickness $h6$, from the fifth thickness $h5$ to a seventh thickness $h7$ so that its front surface 223 goes away from the back surface of the wafer 222 said sixth distance $h6$.

At step 130, the wafer 222, which comprises the deposited polysilicon layer(s) 229, is attached to a wafer carrier of a polishing machine, which is suitable for chemical-mechanical polishing, and only its deposited front surface 223 on the front side of the wafer 222 is exposed to controlled chemical-mechanical polishing, which is carried out by a rotating polishing pad of the polishing machine.

As a result of the chemical-mechanical polishing process, the thickness of the wafer 230 decreases about an eight distance $h8$ from the seventh thickness $h7$ to a tenth thickness $h10$ and the thickness of deposited polysilicon layer(s) 229 decreases about said eight distance $h8$ from the sixth thickness $h6$ to a ninth thickness $h9$ so that its front surface 232 approaches the back surface of the wafer 230 said eight distance $h8$. Additionally, the chemical-mechanical polishing process provides the polysilicon layer(s) 229 with the desired thickness $h9$ and a mirror-polished front surface 232, which is suitable for fusion bonding the hybrid substrate structure 336.

At step 134, the chemical-mechanical polishing process is monitored continuously by measuring polished wafers 230 with an optical measurement (equipment), e.g. interferometry, reflectometry, or ellipsometry, using an optical wavelength range from visible (VIS) to near-infrared (NIR), and at least one chemical-mechanical polishing parameter is controlled continuously.

The operating principle of the optical measurement is based on reflecting broadband light from the front surface 223 and the polysilicon layer(s) interface, and calculating the layer thickness from the resulting spectrum. The reflected light shows a periodic interference spectrum based on the layer thickness versus the wavelength, and the thickness is calculated from the signal by using a theoretical model for a layer having a matching period. The poly-monocrystalline silicon interface produces only a weak reflection due to a small difference in the refractive indices of poly- and monocrystalline silicon materials. A moderate difference is still seen in the visible part of the spectrum, although light absorbance in silicon is high in the same wavelength area. The optimal spectral range found is from 600 nm to 900 nm.

The chemical-mechanical polishing parameter(s) comprises at least one of the removal rate of material from the front surface 223 of the wafer 222 and the polishing time of the front surface 223 of the wafer 222.

At step 136, if it is necessary to adjust the chemical-mechanical polishing parameter(s) because of a predetermined polishing plan or an emerged need as a result of monitoring, said chemical-mechanical polishing parameter(s) is adjusted during the the chemical-mechanical polishing process in order to achieve the desired final layer thickness $h9$ of the polysilicon layer(s) 229 and to complete the polishing step 130 so that the processed wafer 230 is ready for fusion bonding with the active layer 334 in accordance with FIG. 3a to form a hybrid substrate structure 336.

This method 100 addresses the critical importance of the geometry of the wafer 230, especially its non-circular symmetric variation, by carrying out the vast majority of material removal of the wafer shape definition with a circular symmetric, fixed abrasive grinding process. A double-sided variant of this type of process is widely used for reaching very tight geometry in manufacturing 300 mm-diameter wafers, but the same is not possible for smaller wafer sizes relevant to substrates bonded to a single crystal silicon wafer 230.

One-sided grinding tools are commercially available for these wafer sizes, but the typical processes are not capable of the geometric accuracy needed. The method 100 uses very well controlled, single-side grinding to manufacture very accurately defined geometries, resulting a TTV typically in the level of 500 nm in the wafer 230. Importantly, because of the radial processing, this variation mainly appears as a circular symmetric shape with the asymmetric part of the thickness variation being as low as 200 nm.

The invention has been explained above with reference to the above-mentioned exemplary embodiments and its several advantages have been demonstrated. It is clear that the invention is not only restricted to these embodiments, but it comprises all possible embodiments within the scope of following claims.

The invention claimed is:

1. A manufacture method of a high-resistivity silicon handle wafer for enabling a formation of a hybrid substrate structure, comprising steps of
producing a silicon handle wafer having a crystal orientation identifier and a certain thickness,
thinning the silicon handle wafer from the certain thickness to a desired thickness of the silicon handle wafer after the step of producing the silicon handle wafer,
providing a surface passivation layer having a certain layer thickness on a front surface of the silicon handle wafer, and
polishing the surface passivation layer from the certain layer thickness to a desired final layer thickness of the surface passivation layer after the steps of thinning the silicon handle wafer and providing the surface passivation layer so that the front surface of the silicon handle wafer is configured to be active layer bonded to form the hybrid substrate structure,
wherein a resistivity of the silicon handle wafer is above 5000 Ω-cm,
wherein the step of thinning the silicon handle wafer comprises an elimination of an effect of non-circular asymmetry caused by the crystal orientation identifier from silicon handle wafer by means of a controlled single-side, fixed abrasive grinding with a chuck arrangement and a controlled polishing of the silicon handle wafer from its ground front surface to control a condition of the front surface of the silicon handle wafer before the steps of providing the surface passivation layer and polishing the surface passivation layer resulting in manufacturing the silicon handle wafer a desired submicron total thickness variation for the formation of the hybrid substrate structure, and
wherein the step of continuous control of the at least one polishing parameter comprises a monitoring and adjustment of the controlled polishing by a combination of a Makyoh mirror, an optical measurement equipment or a carrier-adjusted capacitive measurement equipment for geometry monitoring, and a surface scanning equipment.

2. The method according to claim 1, wherein the step of controlled single-side, fixed abrasive grinding comprises a continuous control of at least one grinding parameter during the controlled single-side, fixed abrasive grinding and, when necessary, an adjustment of the at least one grinding parameter in order to achieve the desired total thickness variation.

3. The method according to claim 2, wherein the step of continuous control of the at least one grinding parameter comprises a control of at least one of a cooling water temperature of the chuck arrangement, a grinding chuck inclination of the chuck arrangement, and a grinding feed rate of a grinding wheel.

4. The method according to claim 2, wherein the step of continuous control of the at least one grinding parameter comprises a monitoring of the controlled grinding by an optical measurement and/or a charge carrier-adjusted capacitive measurement.

5. The method according to claim 1, wherein the step of controlled polishing comprises polishing of the single-side, fixed abrasive ground handle wafer.

6. The method according to claim 1, wherein the step of controlled polishing comprises a continuous control of at least one polishing parameter during the controlled polishing and, when necessary, an adjustment of the at least one polishing parameter in order to achieve the desired thickness of the wafer.

7. The method according to claim 1, wherein the step of continuous control of the at least one polishing parameter comprises a control of at least one of a polishing pressure of the wafer and a polishing pad, a rotation speed of the wafer and the polishing pad, and a location of the wafer relative to the polishing pad.

8. The method according to claim 1, wherein a diameter of the wafer is 150-200 mm, a surface orientation of the handle wafer is {111}, and the desired total thickness variation of the completed wafer is less than 600 nm.

9. The method according to claim 1, wherein the step of production of the surface passivation layer comprises a deposition of at least one polysilicon layer having the certain layer thickness on the front surface of the thinned wafer by means of a chemical vapour deposition process.

10. The method according to claim 9, wherein the step of polishing of the surface passivation layer comprises a controlled polishing of the at least one deposited polysilicon layer from the certain layer thickness of the at least one deposited polysilicon layer to a desired final layer thickness of the at least one deposited polysilicon layer on the manufactured wafer by means of a chemical-mechanical polishing process in order to provide the chemical-mechanical polished front surface of the wafer.

11. The method according to claim 10, wherein the step of controlled chemical-mechanical polishing comprises a continuous control of at least one chemical-mechanical polishing parameter during the controlled chemical-mechanical polishing and, when necessary, an adjustment of the at least one chemical-mechanical polishing parameter in order to achieve the desired final layer thickness.

12. The method according to claim 11, wherein the step of continuous control of the at least one chemical-mechanical polishing parameter comprises a control of removal rate from a front surface of the wafer and polishing time of the front surface of the wafer.

13. The method according to claim 11, wherein the step of continuous control of the at least one chemical-mechanical polishing parameter comprises a monitoring of the controlled chemical-mechanical polishing by an optical measurement equipment using an optical wavelength range from visible to near-infrared (VIS-NIR) range.

* * * * *